(12) United States Patent
Chuang

(10) Patent No.: US 8,339,218 B2
(45) Date of Patent: Dec. 25, 2012

(54) SINGLE-TO-BALANCED BAND PASS FILTER

(75) Inventor: Chia-Cheng Chuang, Hsinchu (TW)

(73) Assignee: Cyntec Co., Ltd., Science Park, Hsin-Chu (TW)

(*) Notice: Subject to any disclaimer, the term of this patent is extended or adjusted under 35 U.S.C. 154(b) by 331 days.

(21) Appl. No.: 12/871,892

(22) Filed: Aug. 30, 2010

(65) Prior Publication Data

US 2012/0049977 A1 Mar. 1, 2012

(51) Int. Cl.
*H03H 5/00* (2006.01)
*H03H 7/00* (2006.01)
(52) U.S. Cl. ............ 333/177; 333/25; 333/26; 333/167; 333/204
(58) Field of Classification Search ............... 333/25, 333/26, 119, 167, 175–177, 204
See application file for complete search history.

(56) References Cited

U.S. PATENT DOCUMENTS

| 6,137,376 A | 10/2000 | Imbornone |
| 6,954,116 B2 | 10/2005 | Nosaka |
| 7,463,120 B2 | 12/2008 | Matsubara |

FOREIGN PATENT DOCUMENTS

| JP | 2004112787 A | 4/2004 |
| JP | 2005244000 A | 9/2005 |
| KR | 20020049208 A | 6/2002 |
| KR | 100648824 B1 | 11/2006 |

*Primary Examiner* — Robert Pascal
*Assistant Examiner* — Kimberly Glenn
(74) *Attorney, Agent, or Firm* — Winston Hsu; Scott Margo

(57) ABSTRACT

By having stages of a single-to-balanced band pass filter, except for a stage which receives a single-terminal signal, to not be coupled to ground, noises cannot have an available path to enter the single-to-balanced band pass filter so that common-mode signals may be reduced in magnitude.

15 Claims, 8 Drawing Sheets

SINGLE-TO-BALANCED BAND PASS FILTER

BACKGROUND OF THE INVENTION

1. Field of the Invention

The present invention relates to a single-to-balanced band pass filter, and more particularly, to a single-to-balanced band pass filter prevented from disturbing by noises.

2. Description of the Prior Art

Please refer to FIG. 1, which illustrates a balanced-unbalanced converting circuit 21. The balanced-unbalanced converting circuit 21 includes capacitors C1, C2, C3, and C4, and strip lines 22, 23, 24, and 25. The strip lines 22, 23, 24, and 25 have terminals 22a, 22b, 23a, 23b, 24a, 24b, 25a, 25b. The capacitors C1, C2, C3, and C4 are all electrically connected to a ground G. There are also two balanced terminals 26 and 27, an unbalanced terminal 28, and an open terminal 29 in the balanced-unbalanced converting circuit 21. The balanced-unbalanced converting circuit 21 is used for transforming a balanced signal inputted from the balanced terminals 26 and 27, and thereby generating an unbalanced signal at the unbalanced terminal 28.

In the balanced-unbalanced converting circuit 21 shown in FIG. 1, noises may easily be introduced at the ground G and wrongfully effect operations of the balanced-unbalanced converting circuit 21 in forms of common-mode signals.

SUMMARY OF THE INVENTION

The claimed invention discloses a single-to-balanced band pass filter. The single-to-balanced band pass filter comprises a first stage, a second stage, and a third stage. The first stage comprises a first inductor and a second inductor. The first inductor has a first terminal coupled to a single-ended port. The second inductor is coupled to the first inductor. The second stage comprises a third inductor and a first capacitor. The third inductor has an inductive coupling with each of the first and second inductors. The first capacitor is coupled to the third inductor. The third stage comprises a fourth inductor and a second capacitor. The fourth inductor has an inductive coupling with the third inductor. The second capacitor is coupled to the fourth inductor in parallel. Both the second stage and the third stage are not coupled to ground.

These and other objectives of the present invention will no doubt become obvious to those of ordinary skill in the art after reading the following detailed description of the preferred embodiment that is illustrated in the various figures and drawings.

DETAILED DESCRIPTION

The present invention discloses a single-to-balanced band pass filter for preventing from being effected by common-mode signals. Certain stages of the disclosed single-to-balanced band pass filter are not coupled to ground so that the noises cannot be introduced with available paths.

Figure 1:
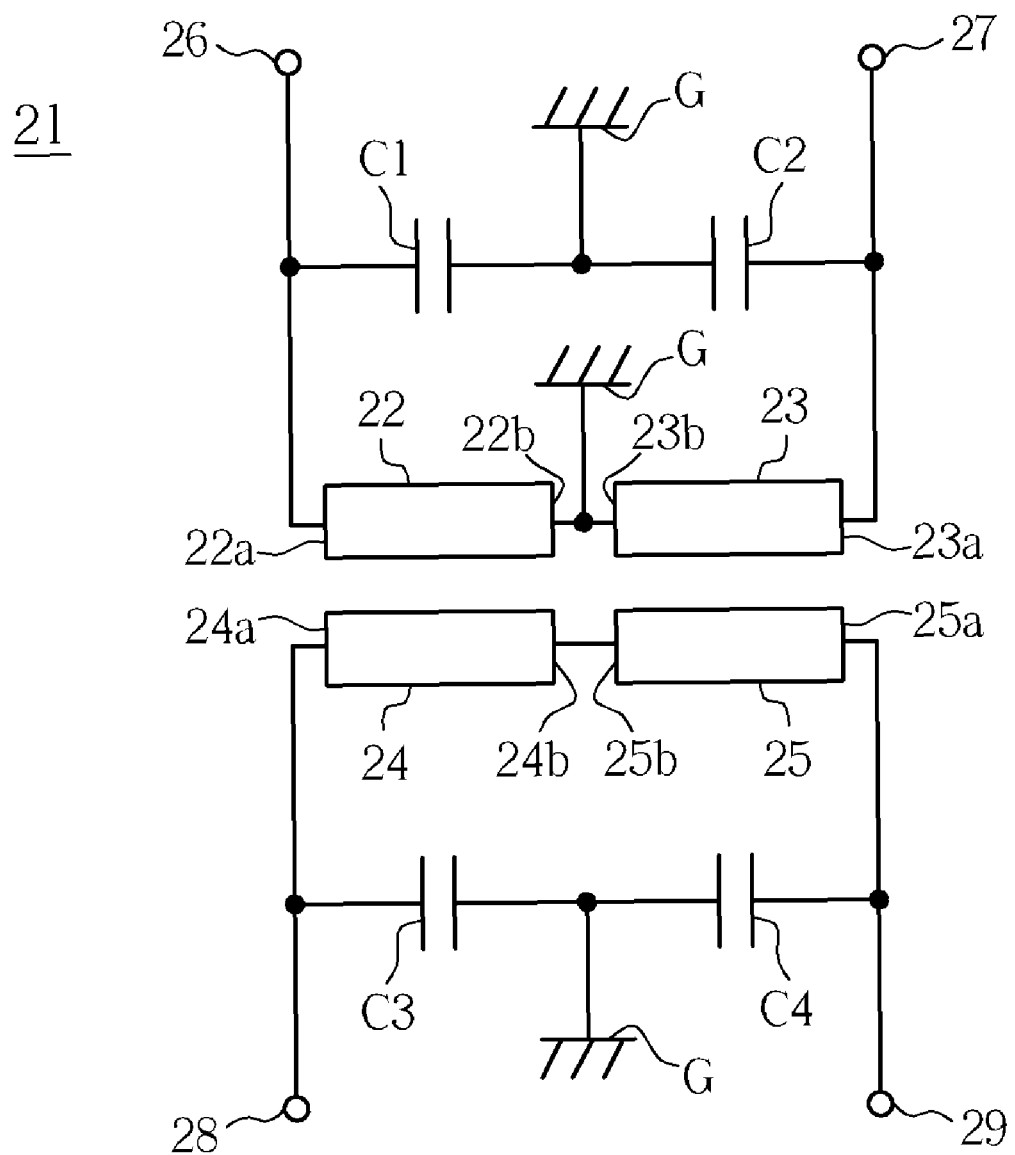
FIG. 1 illustrates a balanced-unbalanced converting circuit.
Figure 2:
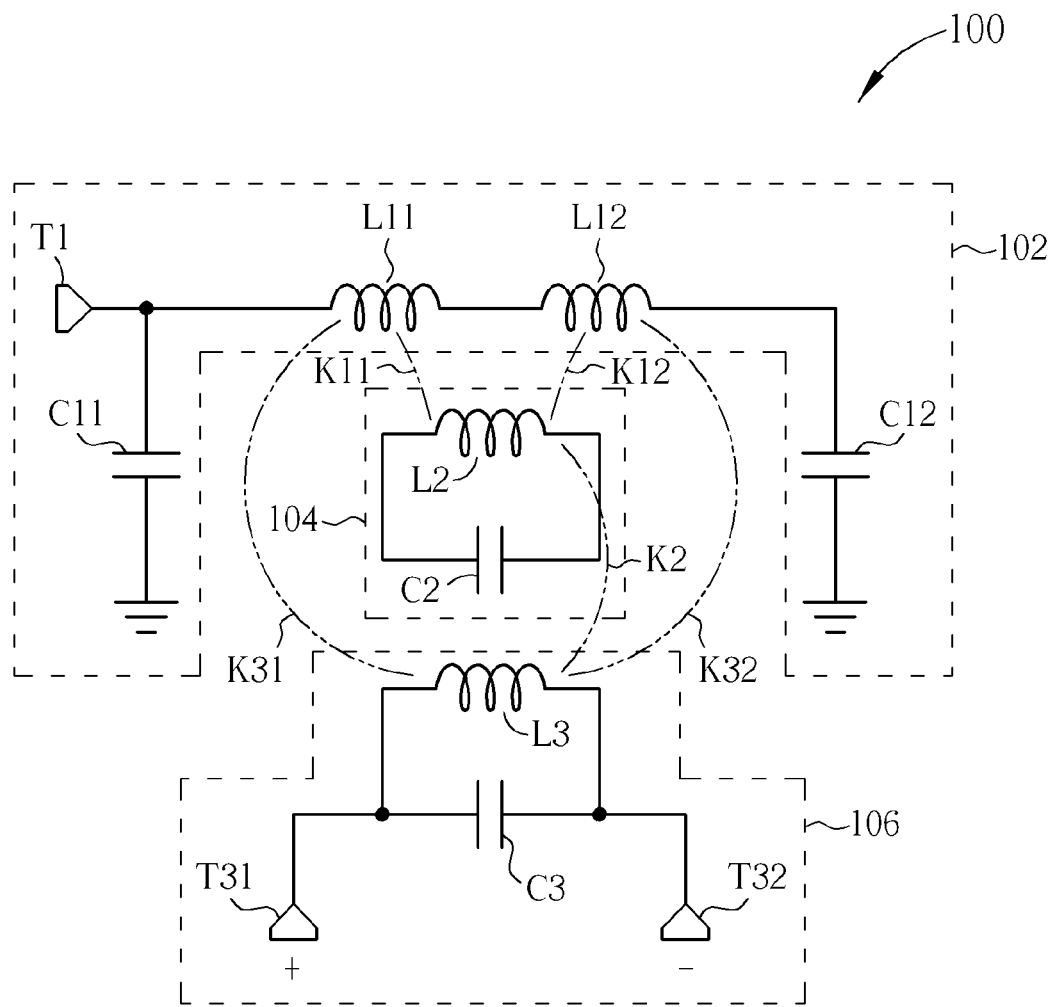
FIG. 2 illustrates a single-to-balanced band pass filter according to a first embodiment of the present invention.

Please refer to FIG. 2, which illustrates a single-to-balanced band pass filter 100 according to a first embodiment of the present invention. The single-to-balanced band pass filter 100 includes a first stage 102, a second stage 104, and a third stage 106.

The first stage 102 is configured to receive single-terminal signals at a terminal T1. The first stage 102 includes inductors L11 and L12, and capacitors C11 and C12. The first inductor L11 has a first terminal coupled to the terminal T1. The second inductor L12 has a first terminal coupled to a second terminal of the first inductor L11. The first capacitor C11 has a first terminal coupled to the first terminal of the inductor L11, and has a second terminal coupled to ground. The second capacitor C12 has a second terminal coupled to the second terminal of the inductor L12, and has a second terminal coupled to ground.

The second stage 104 has a third inductor L2 and a third capacitor C2. The third inductor L2 is coupled to the third capacitor C2 in parallel. The third inductor L2 has a direct inductive coupling with each of the inductors L11 and L12, i.e., inductive couplings K11 and K12 shown in FIG. 2, so as to transform a signal from either of the inductors L11 and L12 to the inductor L2.

The third stage 106 has a fourth inductor L3 and a second capacitor C3. The fourth inductor L3 is coupled to the second capacitor C3 in parallel. The fourth inductor L3 has an inductive coupling K2 with the third inductor K2 for transforming a signal from the second stage 104 to the third stage 106.

The single-to-balanced band pass filter 110 is configured to output a balanced signal through a first output terminal T31 located at a first terminal of the fourth inductor L3, and through a second terminal T32 located at a second terminal of the fourth inductor L3.

Note that both the second stage 104 and the third stage 106 are not coupled to ground. Therefore, while the single-terminal signal is received by the first stage 102 and is then transformed by the second and third stages 104 and 106, the second and third stages 104 and 106 are isolated from noises. Moreover, a quality factor of the second stage 104 may also be raised since the second stage 104 is not coupled to ground, where the second stage 104 is the most significant factor of an entire quality factor of the single-to-balanced band pass filter 110.

There are also indirect inductive couplings in the single-to-balanced band pass filter 110, for example, a first indirect inductive coupling K31 between the inductors L11 and L3 and a second indirect inductive coupling K32 between the inductors L12 and L3. The indirect couplings K31 and K32 may be used for providing a transmission zero around a pass band of the single-to-balanced band pass filter 110, so as to enhance side-band attenuations in differential mode and to further reduce magnitudes of common-mode signals.

Figure 3:
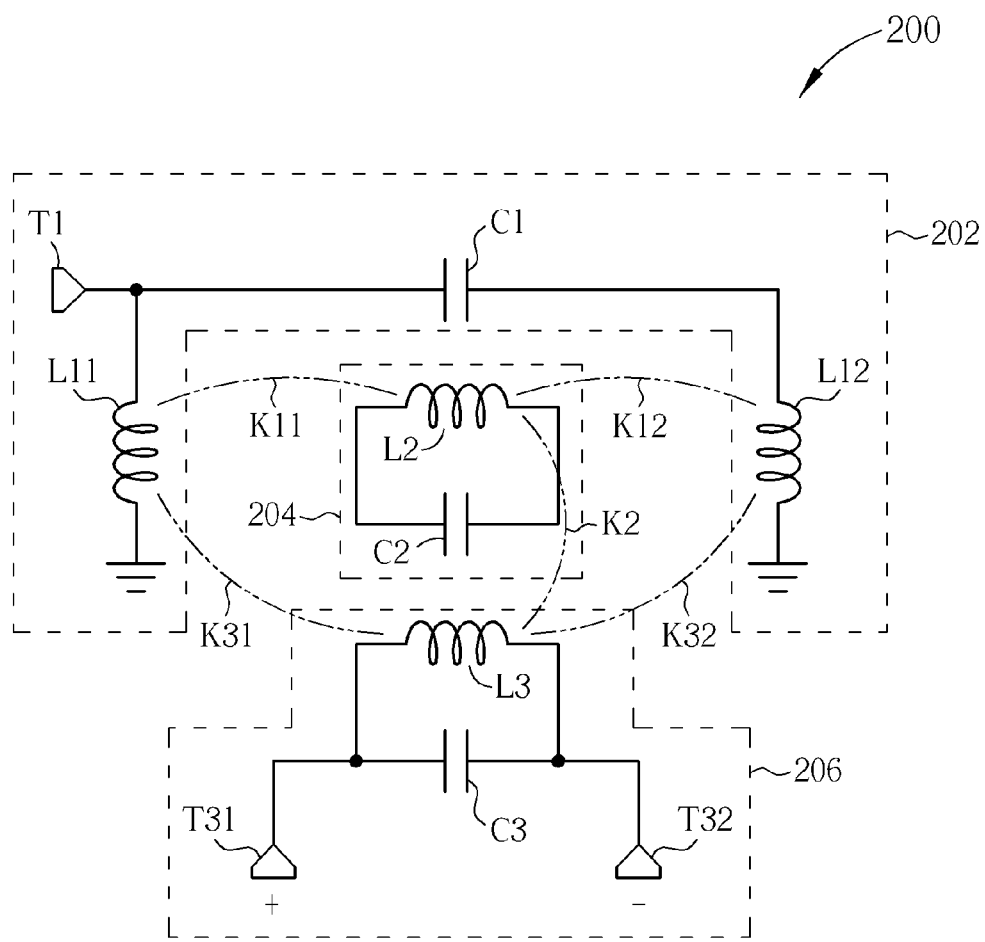
FIG. 3 illustrates a single-to-balanced band pass filter according to a first embodiment of the present invention.

Please refer to FIG. 3, which illustrates a single-to-balanced band pass filter 200 according to a first embodiment of the present invention. The single-to-balanced band pass filter 100 includes a first stage 202, a second stage 204, and a third stage 206. As can be observed in FIG. 3, there are similar elements and couplings between the single-to-balanced band pass filters 100 and 200 so that repeated elements and couplings are described further.

The first stage 202 has the first inductor L11, the second inductor L12, and a first capacitor C1. The first inductor L11 has a first terminal coupled to the terminal T1 for receiving a single-terminal signal, and has a second terminal coupled to ground. The first capacitor C1 has a first terminal coupled to the first terminal of the first inductor L11. The second inductor L12 has a first terminal coupled to a second terminal of the first capacitor, and has a second terminal coupled to ground. There are same inductive couplings between the single-to-balanced band pass filter 200 and 100, and same functions as well, so that repeated inductive couplings are not described further.

Figure 4:
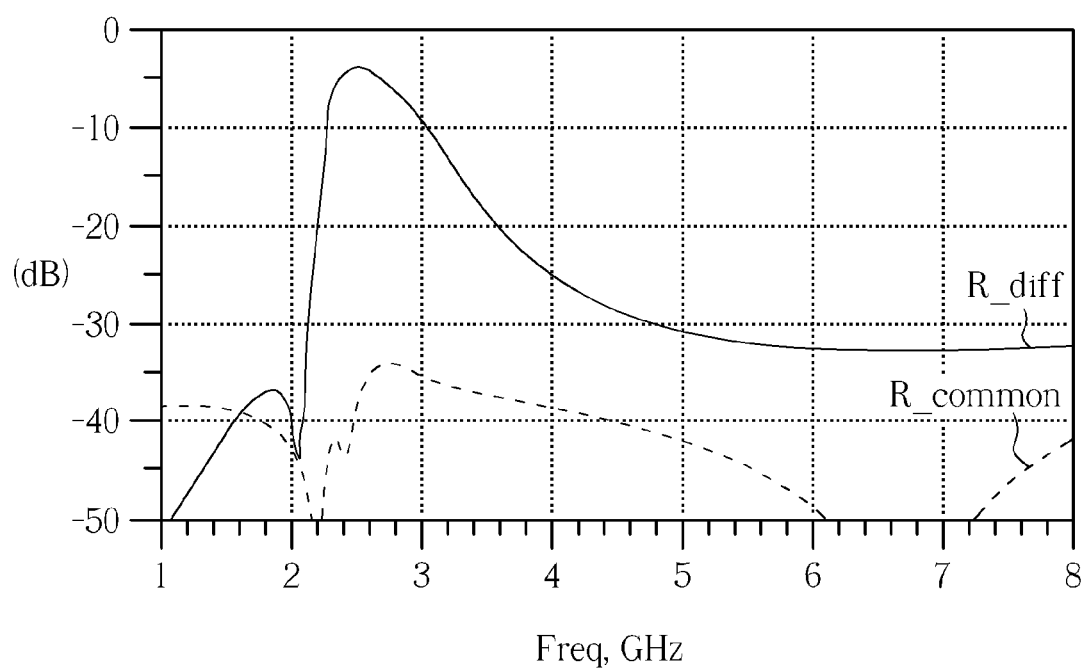
FIG. 4 illustrates a differential frequency response R_diff and a common-mode frequency response R_common of a balanced signal outputted from either one of the single-to-balanced band pass filters shown in FIGS. 2-3.

Please refer to FIG. 4, which illustrates a differential frequency response R_diff and a common-mode frequency response R_common of a balanced signal outputted from either one of the single-to-balanced band pass filters 100 and 200 shown in FIGS. 2-3. As can be observed from FIG. 4, a transmission zero and a pass band of the balanced signal are located between 2-3 GHz, where a magnitude of the common-mode frequency response R_common is close-to-negligible in comparison with a magnitude of the differential frequency response R_diff. The indirect inductive couplings K31 and K32 shown in FIGS. 2-3 help in generating the above-mentioned transmission zero, so as to enhance sideband attenuations in differential mode and to suppress the magnitude of the common-mode frequency response R_common. Therefore, the signal-to-balanced band pass filters 100 and 200 shown in FIGS. 2-3 may be prevented from suffering the common-mode signals.

Figure 5:
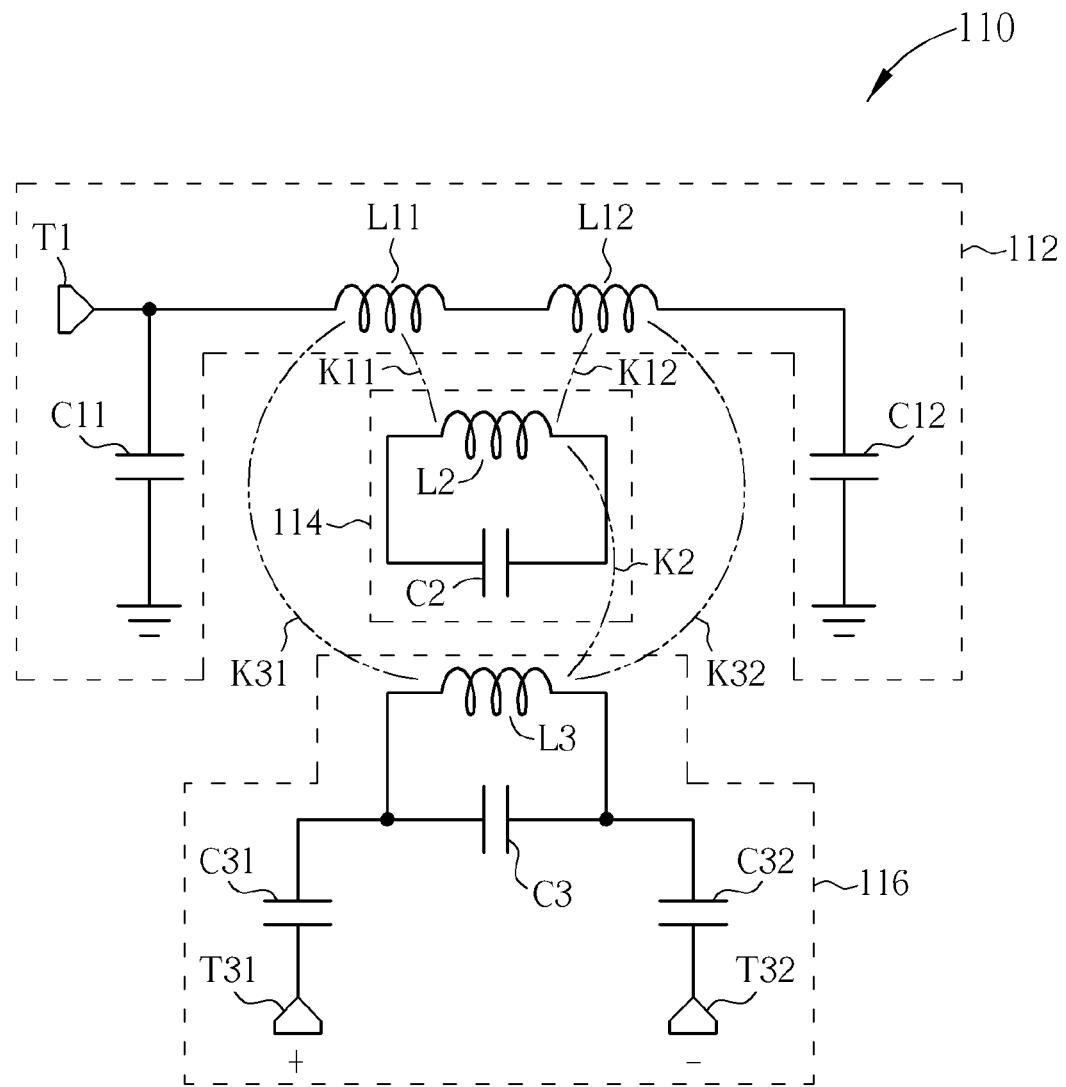
FIGS. 5-6 illustrate signal-to-balanced band pass filters formed from the signal-to-balanced band pass filter shown in FIG.
Figure 6:
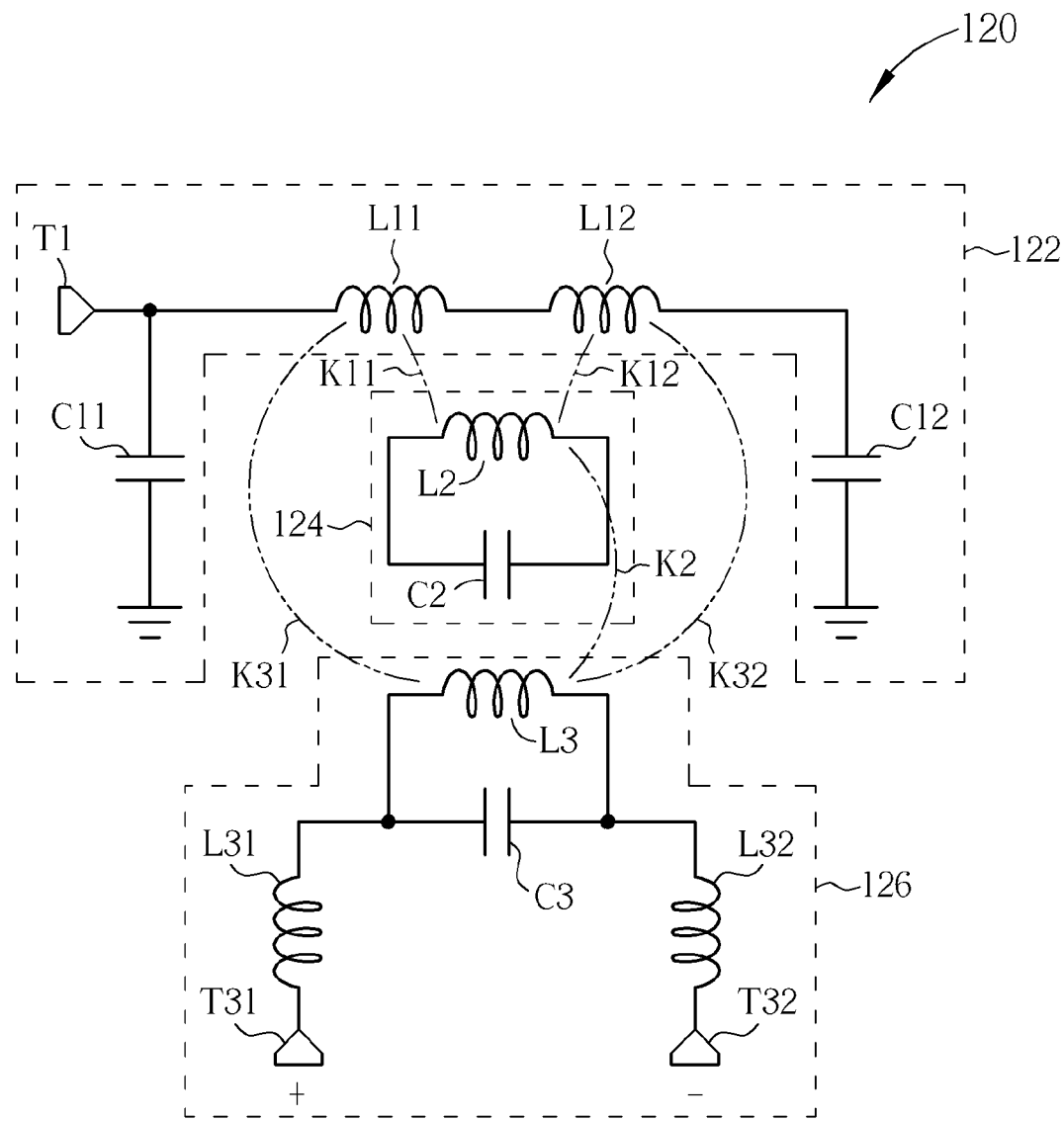
Figure 7:
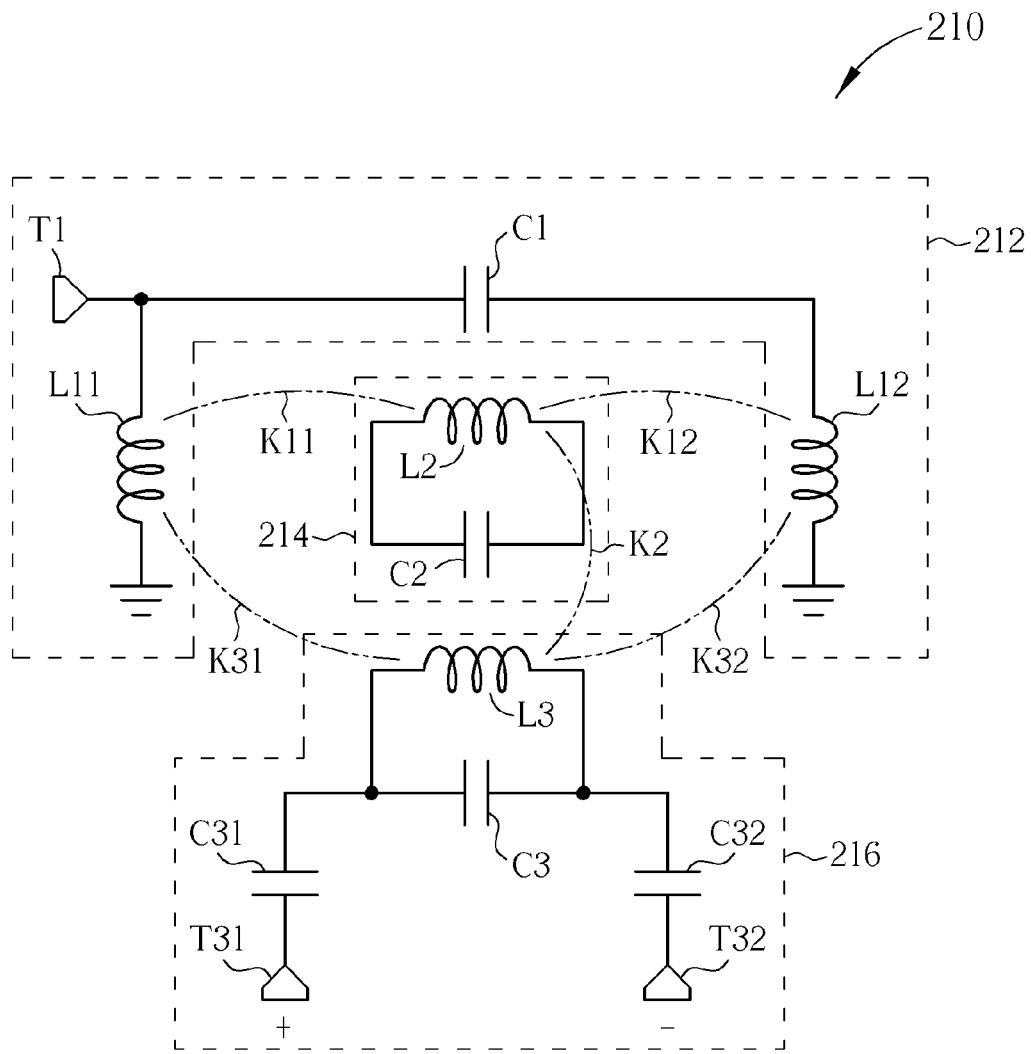
FIGS. 7-8 illustrate signal-to-balanced band pass filters formed from the signal-to-balanced band pass filter shown in FIG. 3.
Figure 8:
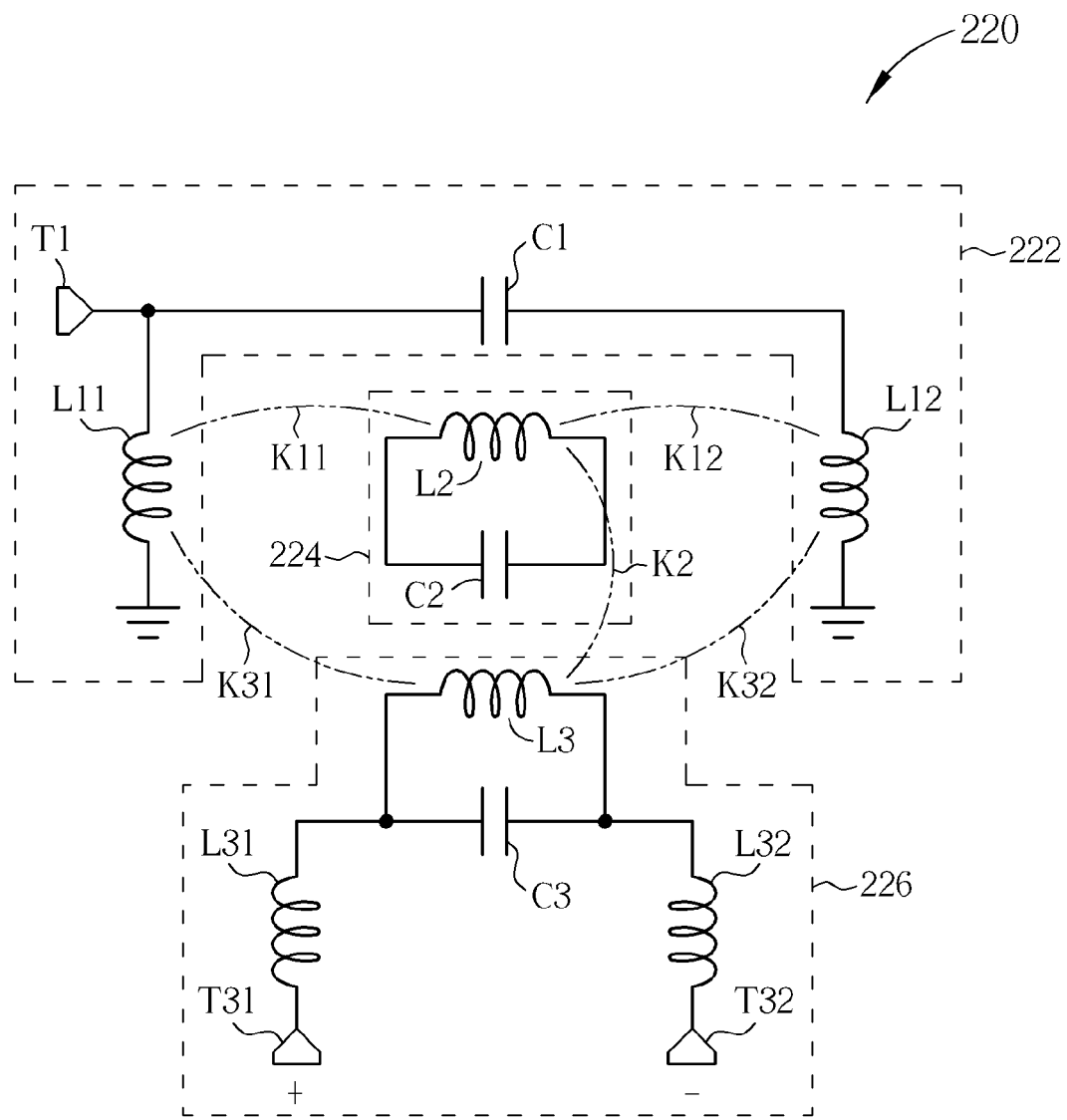

FIGS. 5-8 illustrate certain embodiments of the present invention. FIGS. 5-6 illustrates signal-to-balanced band pass filters 110 and 120 formed from the signal-to-balanced band pass filter 100 shown in FIG. 2. FIGS. 7-8 illustrates signal-to-balanced band pass filters 210 and 220 formed from the signal-to-balanced band pass filter 200 shown in FIG. 3.

In FIG. 5, the signal-to-balanced band pass filter 110 includes a first stage 112, a second stage 114, and a third stage 116. All of the stages 112, 114, and 116 include all elements of the signal-to-balanced band pass filter 100 shown in FIG. 2, and acquire same couplings/direct inductive couplings/indirect inductive couplings as well. Besides, the third stage 116 further includes a fourth capacitor C31 and a fifth capacitor C32. The fourth capacitor C31 has a first terminal coupled to a first terminal of the inductor L3, and has a second terminal coupled to the terminal T31. The fifth capacitor C32 has a first terminal coupled to a second terminal of the inductor L3, and has a second terminal coupled to the terminal T32. The capacitors C31 and C32 have to form impedance matching in the signal-to-balanced band pass filter 110 so that the balanced signal outputted from the terminals T31 and T32 may keep its balance. Similarly, in FIG. 6, the signal-to-balanced band pass filter 120 includes a first stage 122, a second stage 124, and a third stage 126. The stages 122, 124, and 126 also include all elements of the signal-to-balanced band pass filter 100 shown in FIG. 2, and acquire same couplings/direct inductive couplings/indirect inductive couplings as well. The third stage 126 further includes a fifth inductor L31 and a sixth inductor L32. The fifth inductor L31 has a first terminal coupled to a first terminal of the inductor L3, and has a second terminal coupled to the terminal T31. The sixth inductor L32 has a first terminal coupled to a second terminal of the inductor L3, and has a second terminal coupled to the terminal T32. The inductors L31 and L32 have to form impedance matching in the signal-to-balanced band pass filter 120 as well.

In FIG. 7, the signal-to-balanced band pass filter 210 includes a first stage 212, a second stage 214, and a third stage 216. All the stages 212, 214, and 216 includes all elements of the signal-to-balanced band pass filter 200 shown in FIG. 3, and acquire same couplings/direct inductive couplings/indirect inductive couplings as well. The third stage 216 further includes the inductors L31 and L32. Couplings of the inductors L31 and L32 are the same with those disclosed in FIG. 6 so that repeated descriptions are saved herein. Similarly, the signal-to-balanced band pass filter 220 includes a first stage 222, a second stage 224, and a third stage 226. All the stages 222, 224, and 226 includes all elements of the signal-to-balanced band pass filter 200 shown in FIG. 3, and acquire same couplings/direct inductive couplings/indirect inductive couplings as well. The third stage 226 further includes capacitors C31 and C32. Couplings of the capacitors C31 and C32 are the same with those disclosed in FIG. 5 so that repeated descriptions are saved herein.

The present invention discloses a single-to-balanced band pass filter for preventing from noises. By having stages, except for a first stage which receives a single-terminal signal, to not be coupled to ground, noises cannot have an available path to enter the single-to-balanced band pass filter so that common-mode signals may be reduced in magnitude.

Those skilled in the art will readily observe that numerous modifications and alterations of the device and method may be made while retaining the teachings of the invention.

What is claimed is:

1. A single-to-balanced band pass filter, comprising:
   a first stage, comprising:
      a first inductor, having a first terminal coupled to a single-ended port; and
      a second inductor, coupled to the first inductor;
   a second stage, comprising:
      a third inductor, having an inductive coupling with each of the first and second inductors; and
      a first capacitor, coupled to the third inductor; and
   a third stage, comprising:
      a fourth inductor, having an inductive coupling with the third inductor; and
      a second capacitor, coupled to the fourth inductor in parallel;
   wherein both the second stage and the third stage are not coupled to ground.

2. The single-to-balanced band pass filter of claim 1, wherein the first stage further comprises:
   a third capacitor, having a first terminal coupled to the first terminal of the first inductor, and having a second terminal coupled to ground; and
   a fourth capacitor, having a first terminal coupled to the second inductor, and having a second terminal coupled to ground.

3. The single-to-balanced band pass filter of claim 2, wherein the inductive couplings between the first and third inductors, between the second and third inductors, and between the third and fourth inductors, are direct inductive couplings.

4. The single-to-balanced band pass filter of claim 2, wherein there is a first indirect coupling between the first and fourth inductors, and there is a second indirect coupling between the second and fourth inductors.

5. The single-to-balanced band pass filter of claim 1, wherein the first stage further comprises:
   a third capacitor, having a first terminal coupled to the first terminal of the first inductor, and having a second terminal coupled to a first terminal of the second inductor;
   wherein the first inductor has a second terminal coupled to ground, and the second inductor has a second terminal coupled to ground.

6. The single-to-balanced band pass filter of claim 5, wherein the inductive couplings between the first and third inductors, between the second and third inductors, and between the third and fourth inductors, are direct inductive couplings.

7. The single-to-balanced band pass filter of claim 5, wherein there is a first indirect coupling between the first and fourth inductors, and there is a second indirect coupling between the second and fourth inductors.

8. The single-to-balanced band pass filter of claim 1, wherein the third stage further comprises:
   a third capacitor, having a first terminal coupled to a first terminal of the fourth inductor; and
   a fourth capacitor, having a first terminal coupled to a second terminal of the fourth inductor.

9. The single-to-balanced band pass filter of claim 8, wherein the inductive couplings between the first and third inductors, between the second and third inductors, and between the third and fourth inductors, are direct inductive couplings.

10. The single-to-balanced band pass filter of claim 8, wherein there is a first indirect coupling between the first and fourth inductors, and there is a second indirect coupling between the second and fourth inductors.

11. The single-to-balanced band pass filter of claim 8, wherein the third and fourth capacitors are disposed to form impedance matching.

12. The single-to-balanced band pass filter of claim 1, wherein the third stage further comprises:
   a fifth inductor, having a first terminal coupled to a first terminal of the fourth inductor; and
   a sixth inductor, having a first terminal coupled to a second terminal of the fourth inductor.

13. The single-to-balanced band pass filter of claim 12, wherein the inductive couplings between the first and third inductors, between the second and third inductors, and between the third and fourth inductors, are direct inductive couplings.

14. The single-to-balanced band pass filter of claim 12, wherein there is a first indirect coupling between the first and fourth inductors, and there is a second indirect coupling between the second and fourth inductors.

15. The single-to-balanced band pass filter of claim 12, wherein the fifth and sixth inductors are disposed to form impedance matching.

\* \* \* \* \*